United States Patent [19]

Ludwig

[11] 3,821,659

[45] June 28, 1974

[54] CAPACITANCE TO FREQUENCY TRANSDUCER

[75] Inventor: Carl H. Ludwig, Roseland, N.J.

[73] Assignee: The Bendix Corporation, Teterboro, N.J.

[22] Filed: Mar. 28, 1973

[21] Appl. No.: 345,616

[52] U.S. Cl. .................. 331/65, 307/261, 307/271, 328/1, 328/127, 331/1, 331/177 R

[51] Int. Cl. ........................................ H03b 3/04

[58] Field of Search ........ 307/271, 261; 328/1, 127; 331/1, 65, 177

*Primary Examiner*—John Kominski

*Attorney, Agent, or Firm*—Anthony F. Cuoco; S. H. Hartz

[57] ABSTRACT

A capacitance to frequency transducer wherein an alternating signal is filtered and then phase shifted. The filtered signal is applied through a variable capacitor and summed with the phase shifted signal applied through a stable resistor to provide an error signal. The error signal changes the frequency of the alternating signal as a function of capacitance to provide a balancing effect.

7 Claims, 1 Drawing Figure

PATENTED JUN 28 1974 3,821,659
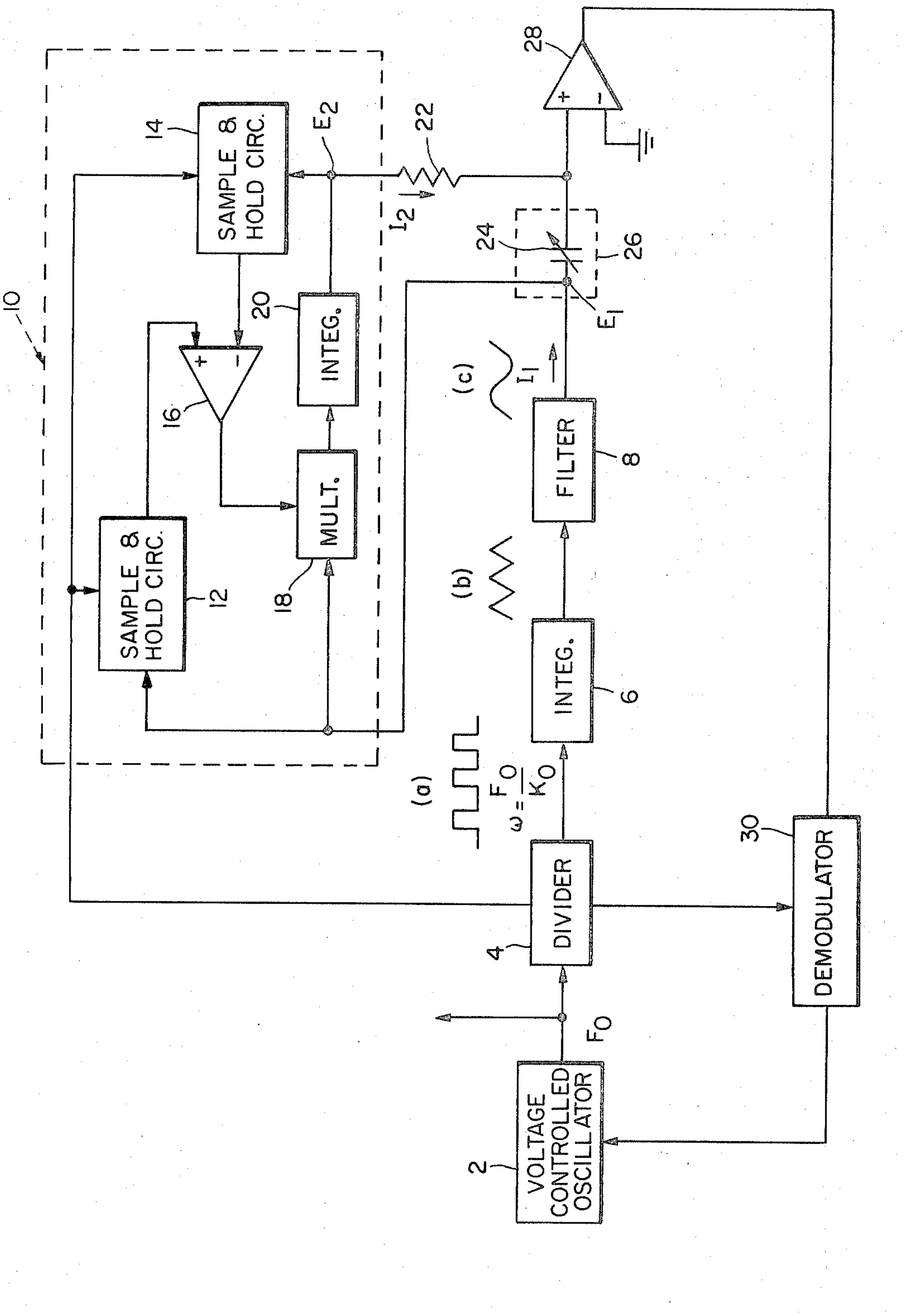

CAPACITANCE TO FREQUENCY TRANSDUCER

BACKGROUND OF THE INVENTION

1. Field of the Invention

This invention relates generally to transducers and particularly to transducers which provide an output corresponding to a sensed condition. More particularly, this invention relates to a capacitive type condition transducer which provides a digital output corresponding to the sensed condition. The invention is specifically described with reference to a capacitive type pressure transducer which provides a digital output corresponding to sensed pressure.

2. Description of the Prior Art

Prior to the present invention capacitive type pressure transducers used, for example, on air data computers have incorporated the conventional arrangement wherein pressure is determined as a function of capacitance and the transducer provides a corresponding analog output. Since most newer type air data computers are digital, it has been necessary to include complex, expensive and space consuming analog to digital converters in this prior art equipment in order to achieve the desired digital results. The present invention overcomes these disadvantages by providing a pressure transducer having a digital output.

SUMMARY OF THE INVENTION

This invention comtemplates a capacitance to frequency transducer including a voltage controlled oscillator for providing a square wave signal. This output is divided down to audio frequencies and integrated to reduce higher order harmonics, after which the output is filtered to provide a sine wave signal which is applied through a capacitor. The sine wave signal is integrated by a constant amplitude integrator to provide a 90° phase shifted signal which is applied through a stable resistor. The current through this resistor which is constant and the current through the capacitor which is 180° out of phase with the resistor current are summed. The resulting error signal is demodulated and the d.c. signal which results is applied to change the frequency of the oscillator output. Since the current through the capacitor is a function of frequency the transducer balances, with the frequency of the oscillator output being a function of capacitance.

One object of this invention is to provide a capacitance to frequency transducer wherein a change in capacitance changes the frequency of an alternating signal.

Another object of this invention is to provide a transducer of the type described wherein a digital output is provided as a function of a change in capacitance, without the need for complex analog to digital conversion apparatus.

Another object of this invention is to provide a capacitance to frequency transducer of the type described which is insensitive to stray capacitance so that small capacitance changes can be measured with extreme accuracy.

Another object of this invention is to provide a capacitance type pressure transducer of the type described wherein the change in frequency is linear with the change in pressure.

Another object of this invention is to provide a balanced capacitance to frequency transducer, wherein the current through the capacitor is a function of frequency and the output frequency of the oscillator is a function of capacitance.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

DESCRIPTION OF THE DRAWING

The single FIGURE in the drawing is a block diagram of a capacitance to frequency transducer according to the invention.

DESCRIPTION OF THE INVENTION

A voltage controlled oscillator (VCO) 2 which may be a 10 MHZ type well known in the art provides an output signal having a frequency $F_0$. The signal from the VCC is applied to a conventional divider 4 which divides frequency $F_0$ down to frequencies in the audio range to provide a square wave signal having a waveform as shown at (a) and a frequency $\omega = F_o/K_o$. The square wave signal is integrated by an integrator 6 to reduce higher order harmonics and to provide a signal having a waveform as shown at (b), and which signal is filtered by a filter 8 to provide a sinusoidal signal as shown at (c) and designated as $E_1$.

Although filter 8 has been shown as providing signal $E_1$, it will be understood that digital apparatus for this purpose may be employed. This apparatus is of the type including, for example, a seven bit counter addressing a ROM (Read Only Memory) code corresponding to the analog value of the sine wave at a predetermined time. The same counter may address a second ROM programmed for a cosine function. This arrangement will provide two sinusoidal signals 90° out of phase while providing minimum amplitude variation with frequency. Apparatus of this type is marketed by Micro Networks Corporation, Worcester, Massachusetts, as the MN 350 Sine Wave Generator.

Sinusoidal signal $E_1$ from filter 8 is applied to constant amplitude integrator 10 including a pair of sample and hold circuits 12 and 14, a summing amplifier 16, a multiplier 18 and an integrator 20. Thus, the sinusoidal signal is applied to sample and hold circuit 12 and to multiplier 18. The output from multiplier 18 drives integrator 20, and the integrated signal therefrom, which is designated as $E_2$, is applied through a stable resistor 22 and to sample and hold circuit 14. Sample and hold circuits 12 and 14 are controlled by the output of divider 4 at a predetermined frequency to provide a phase relationship between signals $E_1$ and $E_2$ as will hereinafter become evident. Amplifier 16 sums the output of the sample and hold circuits and the summed output drives multiplier 18.

Signal $E_2$ is applied through resistor 22 as heretofore noted and signal $E_1$ is applied through a variable capacitor 24 included in a capacitive pressure sensor 24 of the type well known in the art. The currents through the resistor and capacitor are summed by an amplifier 28. The error signal from amplifier 28, which is an alternating signal, is applied to a conventional type demodulator 30 controlled by another output from divider 4 at another predetermined frequency to provide a d.c. signal at a particular time with respect to the alternating error signal. The d.c. output is applied to voltage controlled oscillator 2 for changing the frequency of the voltage controlled oscillator and thereupon balancing the system. Thus, output frequency $F_0$ of voltage controlled oscillator 2 is a function of the capacitance of capacitor 24 and hence a function of pressure.

OPERATION OF THE INVENTION

Sinusoidal signal $E_1$ is integrated by constant amplitude integrator 10 to provide a 90 phase shifted (cos wave) signal $E_2$. Signal $E_2$ is applied through resistor 22 so that the current $I_2$ through the resistor is constant and is bucked by the current $I_1$ through capacitor 24 due to signal $E_1$. $I_1$, then, is 180 out of phase with respect to $I_2$.

As the capacitance of capacitor 24 changes due to a change in the pressure sensed, the error current which is developed is effective after demodulation for changing frequency $F_0$. Since current $I_1$ through the capacitor is a function of frequency, the system balances and frequency $F_0$ is a function of the capacitance of capacitor 24.

In analytical terms $E_1$, $E_2$, $I_1$, and $I_2$ may be expressed as follows:

$$E_1 = K_1 \sin \omega t \quad (1)$$

$$E_2 = -K_1 \cos \omega t \quad (2)$$

$$I_2 = -K_3 \cos \omega t \quad (3)$$

$$I_1 = K_4 (\omega C_{24}) \cos \omega t \quad (4)$$

At equilibrium, $I_1 + I_2 = 0.I_2$ is fixed and therefore $I_1$ must be a constant. As the capacitance of capacitor 24 ($C_{24}$) varies there must be a change in frequency $F_0$ to establish equilibrium.

From equations (3) and (4), the following analysis may be made:

$$I_1 + I_2 = O \text{ (at equilibrium)},$$

therefore, $K_4 \omega C_{24} - K_3 = O$, and $\omega C_{24} = K_3/K_4 = K_5$, where $K_5$ is a constant, $\therefore$ $$\omega = K_5/C_{24} \quad (5)$$

For a parallel plate capacitor 24, the following holds, where e is the dielectric constant, A is the plate area (a constant) and d is the distance, between plates:

$$C = eA/d,$$

or $$C = K_6/d.$$

For most pressure transducers, $d = K_7 + K_8 P$, where P equals pressure. therefore $C = K_6/K_7 + K_8 P$.

Substituting in equation 5, the following results:

$$= \frac{K_5}{\frac{K_6}{K_7 + K_8 P}}$$

$$\omega = K_9 + K_{10} P. \quad (6)$$

It is thus seen that frequency $\omega$ and hence output frequency $F_0$ is a linear function of Pressure P.

It will now be seen from the aforegoing description of the invention that the objects heretofore set forth have been met. A digital output corresponding to pressure is provided without elaborate and expensive analog to digital equipment and the associate interfacing structure. Output frequency variation is linear with pressure and the device is insensitive to stray capacitances to impart a high degree of accuracy to the system.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A capacitance to frequency transducer comprising:
   - means for providing an alternating signal;
   - means for shifting the phase of the alternating signal;
   - a capacitor having a capacitance variable with a condition being connected to the alternating signal means;
   - a resistor connected to the phase shifting means;
   - means connected to the capacitor and to the resistor for summing the alternating signal applied through the capacitor and the phase shifted signal applied through the resistor; and
   - means connected to the summation means and to the alternating signal means for applying the summation signal to the alternating signal means for affecting said means to change the frequency of the alternating signal, said frequency change being a function of the variable capacitance.

2. A capacitance to frequency transducer as described by claim 1, wherein the means for providing an alternating signal includes:
   - an oscillator for providing a signal at an output frequency;
   - a frequency divider connected to the oscillator and responsive to the signal at the output frequency for providing at least one signal at another lesser frequency;
   - means for integrating said one signal; and
   - means connected to the integrating means and responsive to the integrated signal for providing the alternating signal as a sinusoidal signal.

3. A capacitance to frequency transducer as described by claim 1, wherein the means for shifting the phase of the alternating signal includes:
   - integrating means connected to the sinusoidal signal means and to the divider, and including sampling means controlled by another signal from the divider at still another lesser frequency for integrating the sinusoidal signal and for providing a signal having a predetermined phase relationship therewith.

4. A capacitance to frequency transducer as described by claim 1, wherein the means connected to the summation means and to the alternating signal means for applying the summation signal to the alternating signal means for affecting said means to change the frequency of the alternating signal, said frequency being a function of the variable capacitance, includes:

a demodulator for demodulating the summation signal and for applying the demodulated signal to the alternating signal means.

5. A capacitance to frequency transducer as described by claim 4, wherein:

the demodulator is connected to the divider and controlled by still another signal from the divider at yet another lesser frequency to provide the demodulated signal at a particular time with respect to the summation signal.

6. A capacitance to frequency converter as described by claim 2, wherein the means connected to the summation means and to the alternating signal means for applying the summation signal to the alternating signal means for affecting said means to change the frequency of the alternating signal, said frequency being a formation of the variable capacitance, includes:

a demodulator for demodulating the summation signal and for applying the demodulated signal to the oscillator.

7. A capacitance to frequency transducer, comprising:

an oscillator for providing a signal at an output frequency;

a frequency divider connected to the oscillator for dividing the output frequency of the signal therefrom down to a plurality of frequencies within a predetermined range and for providing signals at said frequencies;

an integrator connected to the divider for integrating one of the signals therefrom;

means connected to the integrator for providing a sinusoidal signal in response to the integrated signal;

phase shifting means connected to the sinusoidal signal means and to the divider and controlled by another signal from the divider for providing a signal having a predetermined phase relationship with the sinusoidal signal;

a resistor connected to the phase shifting means;

a capacitor connected to the sinusoidal signal means and having a capacitance which varies with a condition;

means for summing the phase shifted signal applied through the resistor and the sinusoidal signal applied through the capacitor and for providing an error signal;

a demodulator connected to the error signal means and to the divider and controlled by still another signal from the divider to provide a demodulated signal at a particular time with respect to the summation signal; and the oscillator connected to the demodulator and affected by the demodulated signal so that the output frequency changes, said change being a function of the condition.

* * * * *